(12) United States Patent
Seki

(10) Patent No.: US 6,657,377 B2
(45) Date of Patent: Dec. 2, 2003

(54) CYLINDRICAL ELECTRICAL COMPONENT HAVING TWO ELECTRODES ON BOTTOM FACE

(75) Inventor: Hideki Seki, Tokyo (JP)

(73) Assignee: NEC Corporation, Tokyo (JP)

( * ) Notice: Subject to any disclaimer, the term of this patent is extended or adjusted under 35 U.S.C. 154(b) by 414 days.

(21) Appl. No.: 09/729,179

(22) Filed: Dec. 5, 2000

(65) Prior Publication Data

US 2001/0004189 A1 Jun. 21, 2001

(30) Foreign Application Priority Data

Dec. 15, 1999 (JP) .......................................... 11-355388

(51) Int. Cl.[7] ............................................... H01J 61/62
(52) U.S. Cl. ...................... 313/498; 313/631; 313/491; 313/326; 257/99
(58) Field of Search ................................. 313/498, 326, 313/631, 491, 571; 257/104, 106, 79, 99

(56) References Cited

U.S. PATENT DOCUMENTS

| 4,435,268 A | * | 3/1984 | Martin et al. ................ 204/408 |
| 5,054,047 A | * | 10/1991 | Shoulders .................... 378/119 |

FOREIGN PATENT DOCUMENTS

| JP | 62-103957 | * | 5/1987 |
| JP | 5-77931 | | 10/1993 |
| JP | 08-124802 | * | 5/1996 |
| JP | 10-223478 | * | 8/1998 |

* cited by examiner

Primary Examiner—Edward J. Glick
Assistant Examiner—Jurie Yun
(74) Attorney, Agent, or Firm—Sughrue Mion, PLLC

(57) ABSTRACT

In a polarized electrical component, a first electrode is provided at an inner-side bottom face of the component, and a second electrode is provided at an outer-side bottom face of the component. One of the first and second electrodes serves as an anode electrode, and the other serves as a cathode electrode.

20 Claims, 5 Drawing Sheets

CYLINDRICAL ELECTRICAL COMPONENT HAVING TWO ELECTRODES ON BOTTOM FACE

BACKGROUND OF THE INVENTION

1. Field of the Invention

The present invention relates to an electrical component, such as a condenser, a diode, a light emitting diode (LED), a resistor or a winding, to be mounted on a printed circuit board.

2. Description of the Related Art

A prior art electrical component is of a rectangular parallelepiped having two electrodes on its ends. The electrical component is mounted on a printed circuit board by soldering the electrodes thereto.

If the above-described electrical component, however, is polarized, i.e., one of the electrodes serves as an anode electrode and the other serves as a cathode electrode, when the electrical component is mounted to the printed circuit board in the reverse direction, the electrical component would be broken down by an eddy current created by a current flowing through the printed circuit board. At worst, the electrical component would be burned.

SUMMARY OF THE INVENTION

It is an object of the present invention to provide a polarized electrical component such as a polarized condenser, a diode or an LED, capable of preventing the polarized electrical component from being mounted in the reverse direction on a printed circuit board.

According to the present invention, in a polarized electrical component, a first electrode is provided at an inner-side bottom face of the component, and a second electrode is provided at an outer-side bottom face of the component. One of the first and second electrodes serves as an anode electrode, and the other serves as a cathode electrode.

The polarized electrical component can be applied to a non-polarized electrical component where a first electrode is provided at an inner-side bottom face of the component and a second electrode is provided at an outer-side bottom face of the component.

BRIEF DESCRIPTION OF THE DRAWINGS

The present invention will be more clearly understood from the description set forth below, with reference to the accompanying drawings, wherein.

DESCRIPTION OF THE PREFERRED EMBODIMENTS

Figure 1:
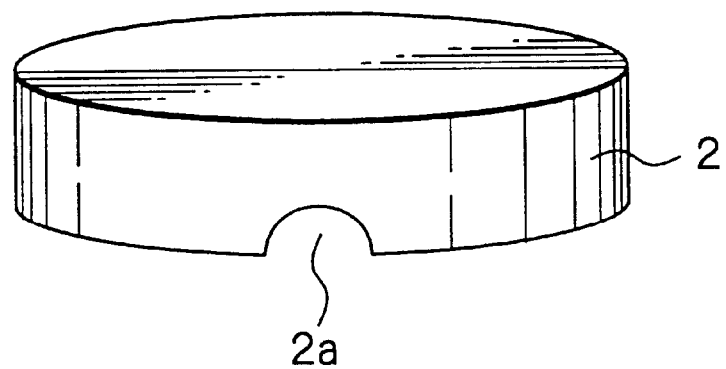
FIG. 1 is a perspective top view illustrating a first embodiment of the electrical component according to the present invention.
Figure 2:
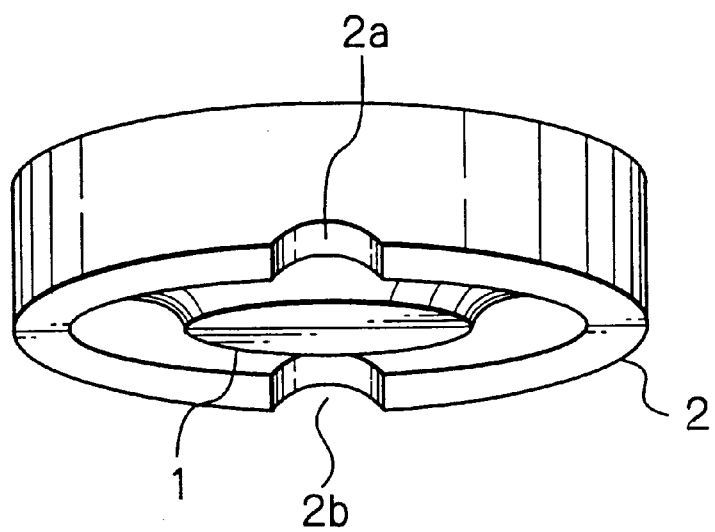
FIG. 2 is a perspective bottom view of the electrical component of FIG. 1.

In FIGS. 1 and 2, which are perspective top and bottom views, respectively, illustrating a first embodiment of the electrical component according to the present invention, the electrical component is cylindrical and is constructed by an electrode 1 provided at an inner-side bottom face and an electrode 2 provided at an outer-side bottom face. As a result, the electrode 2 surrounds the electrode 1.

If the electrical component is a polarized electrical component such as a polarized condenser, a diode or an LED, the electrode 1 serves as an anode electrode and the electrode 2 serves as a cathode electrode.

Also, two openings 2a and 2b are provided at the electrode 2 to take air thereinto.

Figure 3A:
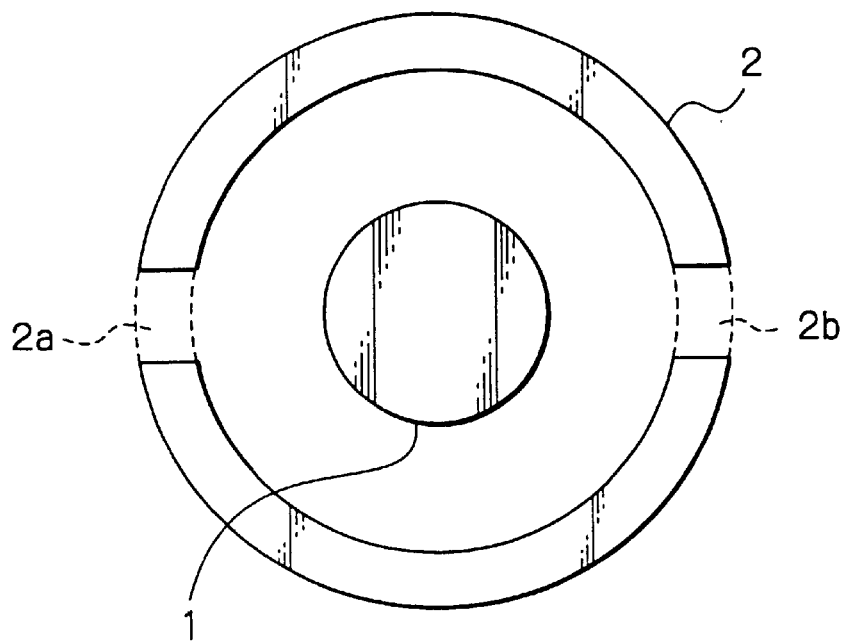
FIG. 3A is a bottom view of the electrical component of FIG. 1.
Figure 3B:
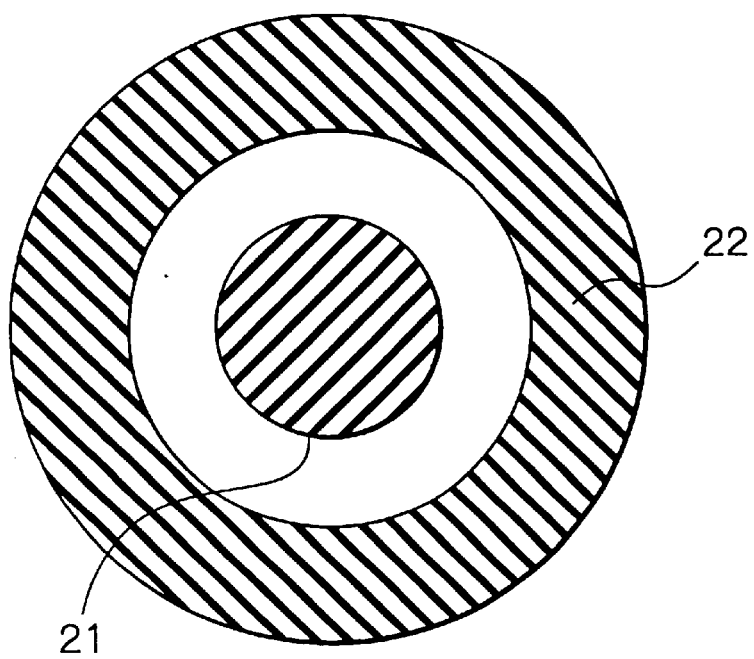
FIG. 3B is a plan view of a printed circuit board on which the electrical component of FIG. 3A is mounted.

The method for mounting the electrical component of FIGS. 1 and 2 having a bottom configuration as illustrated in FIG. 3A mounted on a printed circuit board as illustrated in FIG. 3B is explained below. That is, the printed circuit board of FIG. 3B has a pad 21 corresponding to the electrode 1 of FIG. 3A and a pad 22 corresponding to the electrode 2 of FIG. 3B. First, solder paste is coated on the pads 21 and 22. Then, the electrical component of FIG. 3A is placed on the pads 21 and 22 of the printed circuit board of FIG. 3B by an automatic machine (not shown). Then, the electrical component of FIG. 3A and the printed circuit board of FIG. 3B are exposed to hot air flow, thus reflowing the solder paste. In this case, hot air easily reaches the electrode 1 and the pad 21 via the openings 2a and 2b, so that the solder paste at the pad 21 is effectively reflown.

Figure 4A:
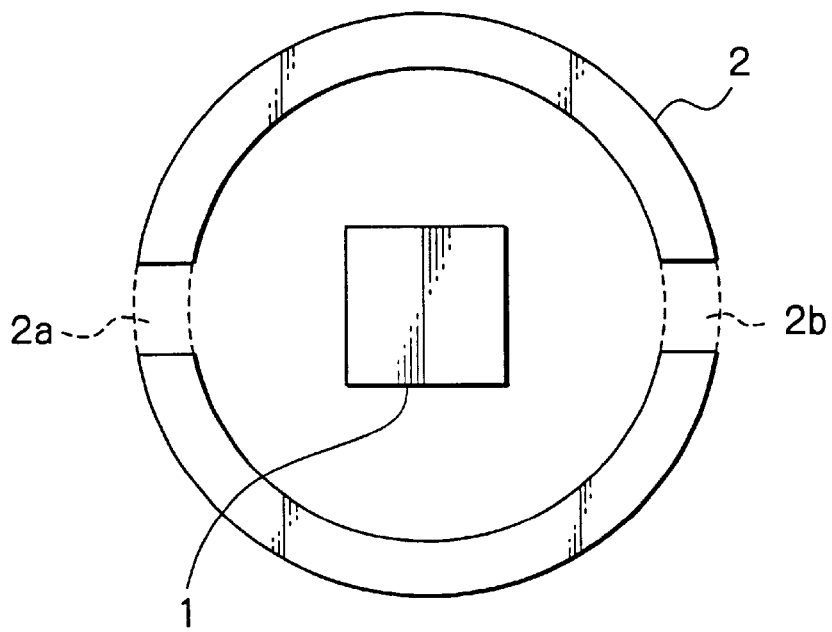
FIG. 4A is a bottom view illustrating a second embodiment of the electrical component according to the present invention.
Figure 4B:
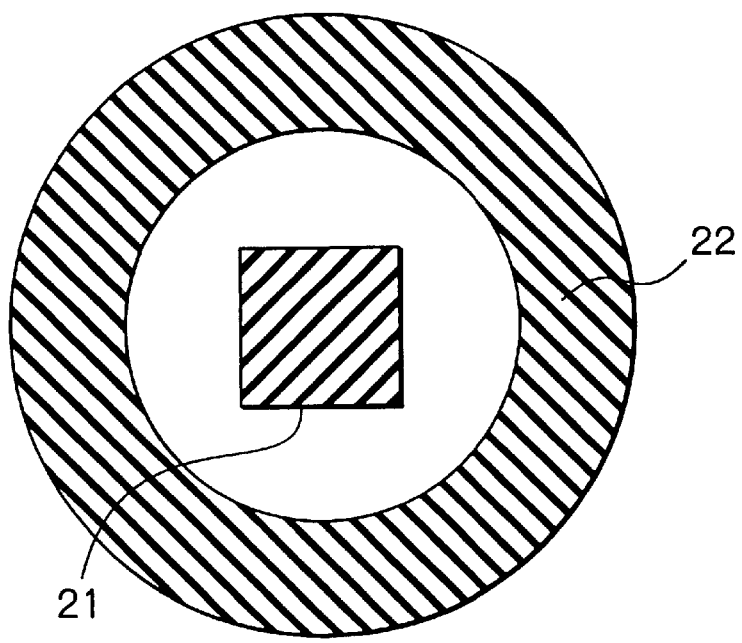
FIG. 4B is a plan view of a printed circuit board on which the electrical component of FIG. 4A is mounted.

In FIG. 4A, which illustrates a second embodiment of the electrical component according to the present invention, the electrical component 1 is rectangular. In this case, as illustrated in FIG. 4B, the pad 21 of the printed circuit board is also rectangular. Thus, the electrical component of FIG. 4A can be easily mounted on the printed circuit board of FIG. 4B.

Figure 5A:
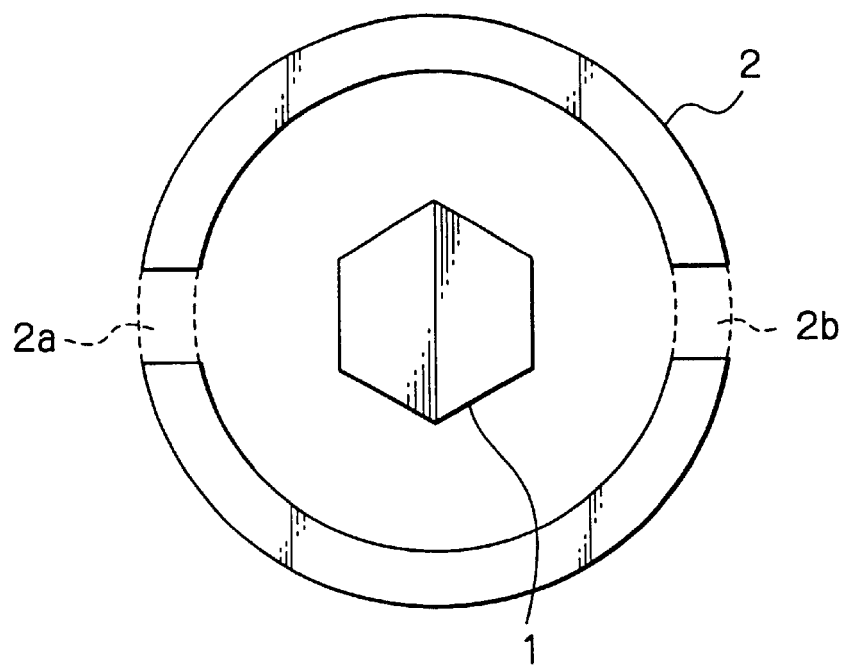
FIG. 5A is a bottom view illustrating a third embodiment of the electrical component according to the present invention.
Figure 5B:
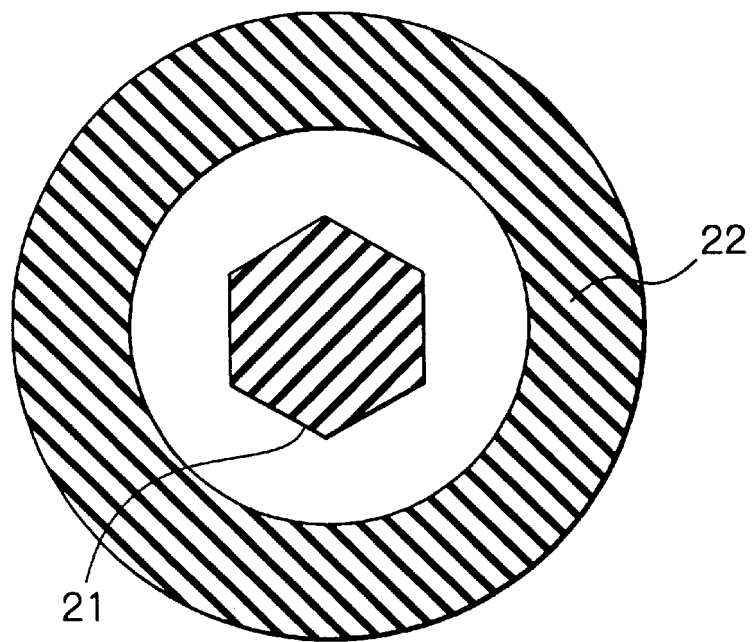
FIG. 5B is a plan view of a printed circuit board on which the electrical component of FIG. 5A is mounted.

In FIG. 5A, which illustrates a third embodiment of the electrical component according to the present invention, the electrical component 1 is polygonal; in this case, hexagonal. In this case, as illustrated in FIG. 5B, the pad 21 of the printed circuit board is also polygonal. Thus, the electrical component of FIG. 5A can be easily mounted on the printed circuit board of FIG. 5B.

Figure 6A:
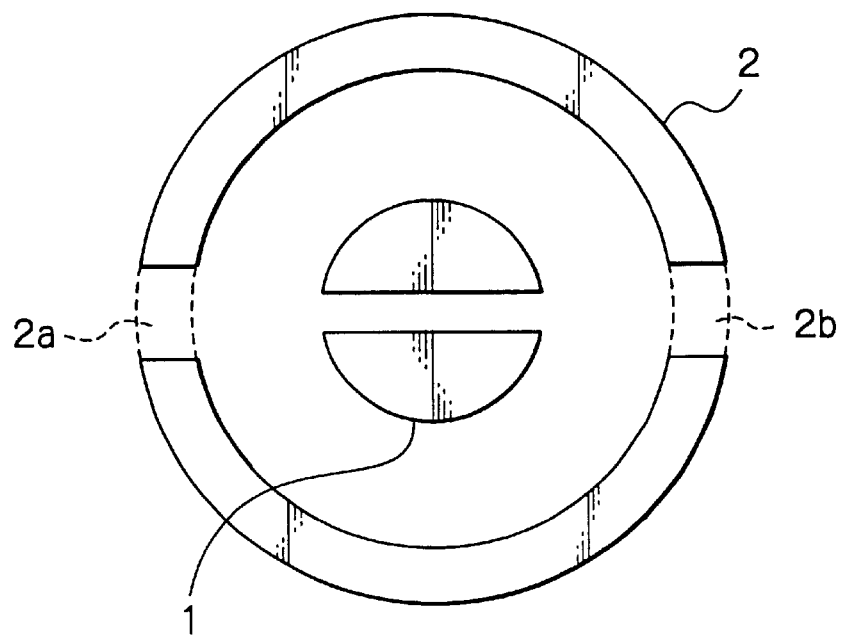
FIG. 6A is a bottom view illustrating a fourth embodiment of the electrical component according to the present invention.
Figure 6B:
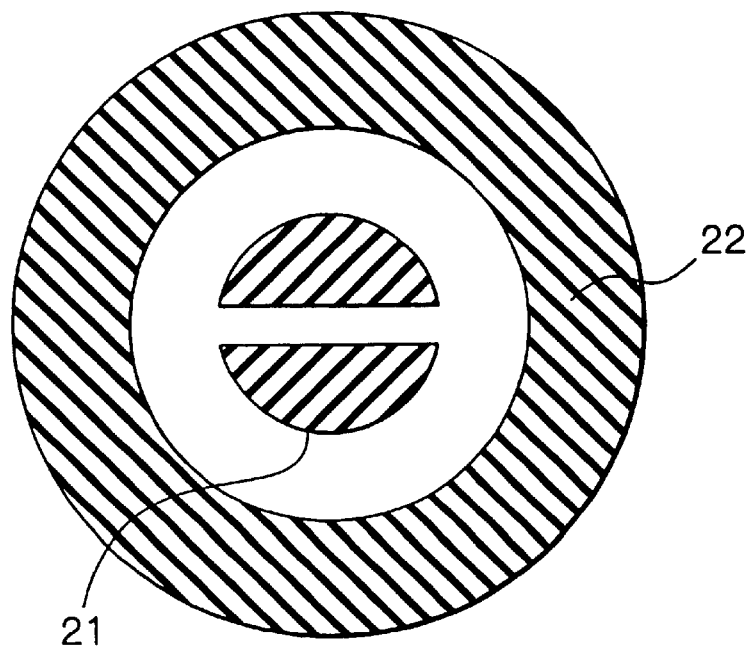
FIG. 6B is a plan view of a printed circuit board on which the electrical component of FIG. 6A is mounted.

In FIG. 6A, which illustrates a fourth embodiment of the electrical component according to the present invention, the electrical component 1 is half-round, i.e., has a pair of half-round bottom faces. In this case, as illustrated in FIG. 6B, the pad 21 of the printed circuit board is also half-round. Thus, the electrical component of FIG. 6A can be easily mounted on the printed circuit board of FIG. 6B.

In the above-described embodiments, the electrical component is polarized; however, the present invention can be applied to a non-polarized electrical component such as a non-polarized condenser, a resistor or a winding.

As explained hereinabove, according to the present invention, even if an electrical component is polarized, the electrical component can be prevented from being mounted in the reverse direction on a printed circuit board, so as not to break down the electrical component.

What is claimed is:

1. A polarized electrical component comprising:
   a first electrode provided at an inner-side bottom face of said component; and
   a second electrode provided at an outer-side bottom face of said component,
   one of said first and second electrodes serving as an anode electrode, the other of said first and second electrodes serving as a cathode electrode,
   wherein said second electrode surrounds said first electrode, and
   wherein said second electrode has at least two openings for taking air thereinto.

2. The polarized electrical component as set forth in claim 1, being cylindrical.

3. The polarized electrical component as set forth in claim 1, wherein said first electrode has a circular bottom face.

4. The polarized electrical component as set forth in claim 1, wherein said first electrode has a rectangular bottom face.

5. The polarized electrical component as set forth in claim 1, wherein said first electrode has a polygonal bottom face.

6. The polarized electrical component as set forth in claim 1, wherein said first electrode has a pair of half-round bottom faces.

7. The polarized electrical component as set forth in claim 6, wherein a first opening of said at least two openings is provided at a first side of said outer-side bottom face of said component, and a second opening of said at least two openings is provided at a second side of said outer-side bottom face of said component, said first side and said second side being at opposite sides of said bottom face, and
   wherein said first electrode provides a third opening between said pair of half-round bottom faces, said third opening being aligned with said first opening to said second opening of said second electrode.

8. The polarized electrical component as set forth in claim 1, being a polarized condenser.

9. The polarized electrical component as set forth in claim 1, being a diode.

10. The polarized electrical component as set forth in claim 1, being a light emitting diode.

11. A non-polarized electrical component comprising:
    a first electrode provided at an inner-side bottom face of said component; and
    a second electrode provided at an outer-side bottom face of said component,
    wherein said second electrode surrounds said first electrode, and
    wherein said second electrode has at least two openings for taking air thereinto.

12. The non-polarized electrical component as set forth in claim 11, being cylindrical.

13. The non-polarized electrical component as set forth in claim 11, wherein said first electrode has a circular bottom face.

14. The non-polarized electrical component as set forth in claim 11, wherein said first electrode has a rectangular bottom face.

15. The non-polarized electrical component as set forth in claim 11, wherein said first electrode has a polygonal bottom face.

16. The non-polarized electrical component as set forth in claim 11, wherein said first electrode has a pair of half-round bottom faces.

17. The non-polarized electrical component as set forth in claim 16, wherein a first opening of said at least two openings is provided at a first side of said outer-side bottom face of said component, and a second opening of said at least two openings is provided at a second side of said outer-side bottom face of said component, said first side and said second side being at opposite sides of said bottom face, and
    wherein said first electrode provides a third opening between said pair of half-round bottom faces, said third opening being aligned with said first opening to said second opening of said second electrode.

18. The non-polarized electrical component as set forth in claim 11, being a non-polarized condenser.

19. The non-polarized electrical component as set forth in claim 11, being a resistor.

20. The non-polarized electrical component as set forth in claim 11, being a winding.

* * * * *